United States Patent
Luo et al.

(10) Patent No.: US 11,057,150 B2
(45) Date of Patent: Jul. 6, 2021

(54) POLAR CODE TRANSMISSION METHOD AND APPARATUS

(71) Applicant: Huawei Technologies Co., Ltd., Shenzhen (CN)

(72) Inventors: Hejia Luo, Hangzhou (CN); Shengchen Dai, Hangzhou (CN); Ying Chen, Hangzhou (CN); Gongzheng Zhang, Hangzhou (CN); Rong Li, Hangzhou (CN); Chaolong Zhang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 39 days.

(21) Appl. No.: 16/544,529

(22) Filed: Aug. 19, 2019

(65) Prior Publication Data
US 2019/0372711 A1 Dec. 5, 2019

Related U.S. Application Data

(63) Continuation of application No. PCT/CN2018/075464, filed on Feb. 6, 2018.

(30) Foreign Application Priority Data

Feb. 17, 2017 (CN) .......................... 201710087449.X (51) Int. Cl.
*H04B 7/216* (2006.01)
*H04L 1/00* (2006.01)
(Continued)

(52) U.S. Cl.
CPC ........ *H04L 1/0056* (2013.01); *H04L 27/2601* (2013.01); *H04L 69/324* (2013.01); *H04W 72/005* (2013.01); *H04W 72/0466* (2013.01)

(58) Field of Classification Search
CPC .. H03M 13/09; H03M 13/13; H03M 13/3738; H03M 13/3769; H04L 1/00;
(Continued)

(56) References Cited

U.S. PATENT DOCUMENTS

2012/0198305 A1 8/2012 Abu-Surra et al.
2014/0169388 A1* 6/2014 Jeong ................. H03M 13/1191
370/474
(Continued)

FOREIGN PATENT DOCUMENTS

| CN | 104854813 A | 8/2015 |
| CN | 105262494 A | 1/2016 |
| CN | 106230555 A | 12/2016 |

OTHER PUBLICATIONS

Xinfei, "Research on the Physical Broadcast Channel Information Extraction of TD-LTE Using FPGA," pp. 1-55, Hebei University of Technology (Dec. 2014) with English Abstract.
(Continued)

*Primary Examiner* — Minh Trang T Nguyen
(74) *Attorney, Agent, or Firm* — Leydig, Voit & Mayer, Ltd.

(57) ABSTRACT

This application discloses a transmission method, a transmission apparatus, and a communications device. The transmission method includes: performing polar encoding on a bit sequence, to obtain an encoded sequence, where the bit sequence includes control information and a cyclic redundancy check CRC sequence; fragmenting the encoded sequence, to obtain n encoded subsequences, where n is an integer, and n>0; and scrambling the n encoded subsequences by using n scrambling sequences respectively, to obtain n scrambled sequences. In the transmission method, the n scrambling sequences are newly defined based on encoding and decoding features of a polar code, and the n scrambling sequences additionally carry $\lceil \log_2 n \rceil$-bit information. According to the foregoing encoding method, signaling overheads are reduced.

7 Claims, 9 Drawing Sheets

(51) Int. Cl.
*H04L 27/26* (2006.01)
*H04L 29/08* (2006.01)
*H04W 72/00* (2009.01)
*H04W 72/04* (2009.01)

(58) Field of Classification Search
CPC . H04L 1/0056; H04L 27/2601; H04L 69/324; H04W 72/005; H04W 72/0466
See application file for complete search history.

(56) References Cited

U.S. PATENT DOCUMENTS

2015/0092671 A1 4/2015 Fiallos et al.
2015/0358113 A1* 12/2015 Callard .................. H04L 1/0041
714/776

OTHER PUBLICATIONS

"Evaluation of Polar Codes for eMBB Scenario," 3GPP TSG RAN WG1 Meeting #85, Nanjing, China, R1-164375, pp. 1-9, 3rd Generation Partnership Project—Valbonne, France (May 23-27, 2016).
"Soft-combining for PBCH," 3GPP TSG RAN WG1 Meeting #89, Hangzhou, China, R1-1708158, pp. 1-10, 3rd Generation Partnership Project, Valbonne, France (May 15-19, 2017).
"PBCH Enhancement with Polar Code," 3GPP TSG RAN WG1 AH_NR Meeting, Spokane, USA, R1-1700169, pp. 1-5, 3rd Generation Partnership Project, Valbonne, France (Jan. 16-20, 2017).
Sesia et al., "LTE—The UMTS Long Term Evolution: From Theory to Practice, Chapter 9: Downlink Physical Data and Control Channels," XP55349815, Second Edition, John Wiley and Sons (Aug. 29, 2011).

* cited by examiner

Arikan polar code

| A terminal receives a symbol sequence, where the symbol sequence is obtained by a network device after the network device encodes control information by using a polar code, and scrambles, modulates, and maps encoded control information | 410 |

↓

| The terminal demaps and demodulates the symbol sequence, to obtain an encoded sequence | 420 |

↓

| The terminal selects at least one encoded subsequence from the encoded sequence | 430 |

↓

| The terminal performs polar decoding on the at least one encoded subsequence, to obtain a bit sequence, where the bit sequence includes the control information and a CRC sequence | 440 |

↓

| The terminal performs a descrambling operation on the bit sequence by using at least one descrambling sequence, and performs CRC check on a descrambled bit sequence, to obtain the control information and timing information if the CRC check succeeds | 450 |

POLAR CODE TRANSMISSION METHOD AND APPARATUS

CROSS-REFERENCE TO RELATED APPLICATIONS

This application is a continuation of International Application No. PCT/CN2018/075464, filed on Feb. 6, 2018, which claims priority to Chinese Patent Application No. 201710087449.X, filed on Feb. 17, 2017. The disclosures of the aforementioned applications are hereby incorporated by reference in their entireties.

TECHNICAL FIELD

Embodiments of this application relate to the field of communications technologies, and in particular, to a polar code transmission method and apparatus.

BACKGROUND

Figure 1:
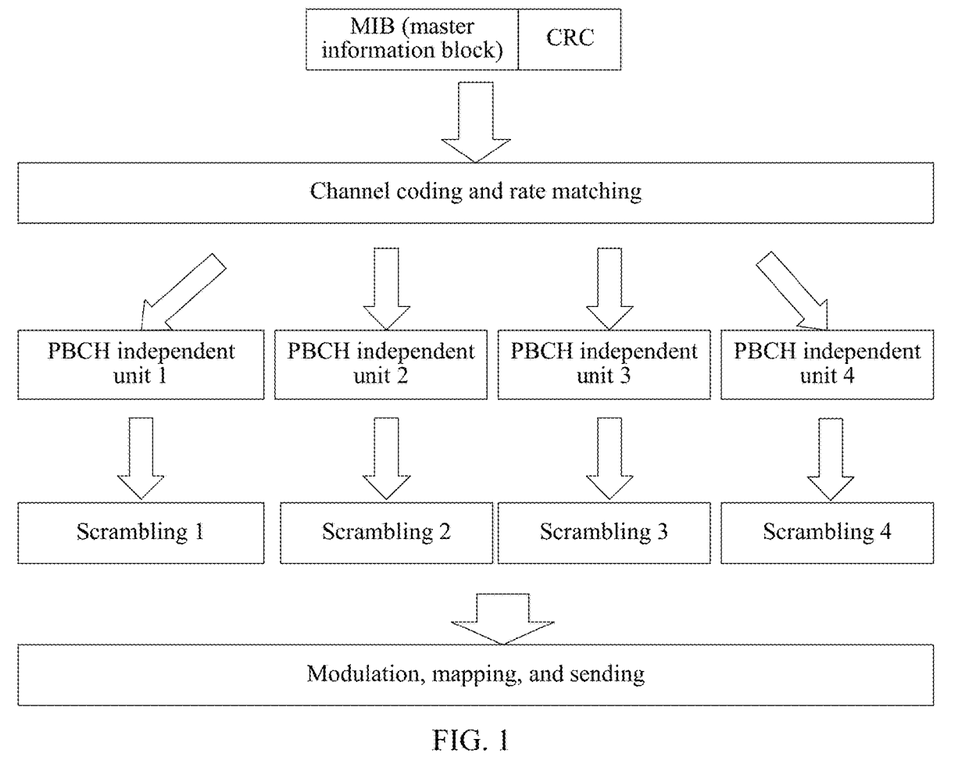
FIG. 1 shows a processing process of a PBCH at a transmit end in LTE.

In a long term evolution (LTE) system, a physical broadcast channel (PBCH) carries a master information block (MIB). The MIB has a length of 24 bits, and includes content such as downlink system bandwidth, a PHICH (Physical Hybrid Automatic Repeat Request (ARQ) Indicator Channel) size, and eight most significant bits of a system frame number (SFN). A processing process of a Physical Broadcast Channel (PBCH) at a transmit end is shown in FIG. 1. A base station first performs cyclic redundancy check (CRC) encoding on a to-be-sent MIB, to obtain a 16-bit CRC sequence. Then, the base station performs channel coding and rate matching on a 40-bit sequence (including a 24-bit MIB and 16-bit CRC), to obtain an encoded sequence, segments the encoded sequence to obtain four PBCH independent units of an equal size, and scrambles the four PBCH independent units by using four scrambling code sequences respectively. The base station completes modulation, mapping, and sending procedures that are subsequent to the scrambling.

Channel coding on the PBCH is TBCC (Tailing bit convolution coding), and different phases are used for the four scrambling code sequences. The four PBCH independent units carry same encoded bits. After the procedures such as scrambling, modulation, and mapping are performed on the four PBCH independent units, the four PBCH independent units are sent in a time window of 40 ms (namely, a transmission time of four radio frames, where each radio frame is for 10 ms).

Figure 2:
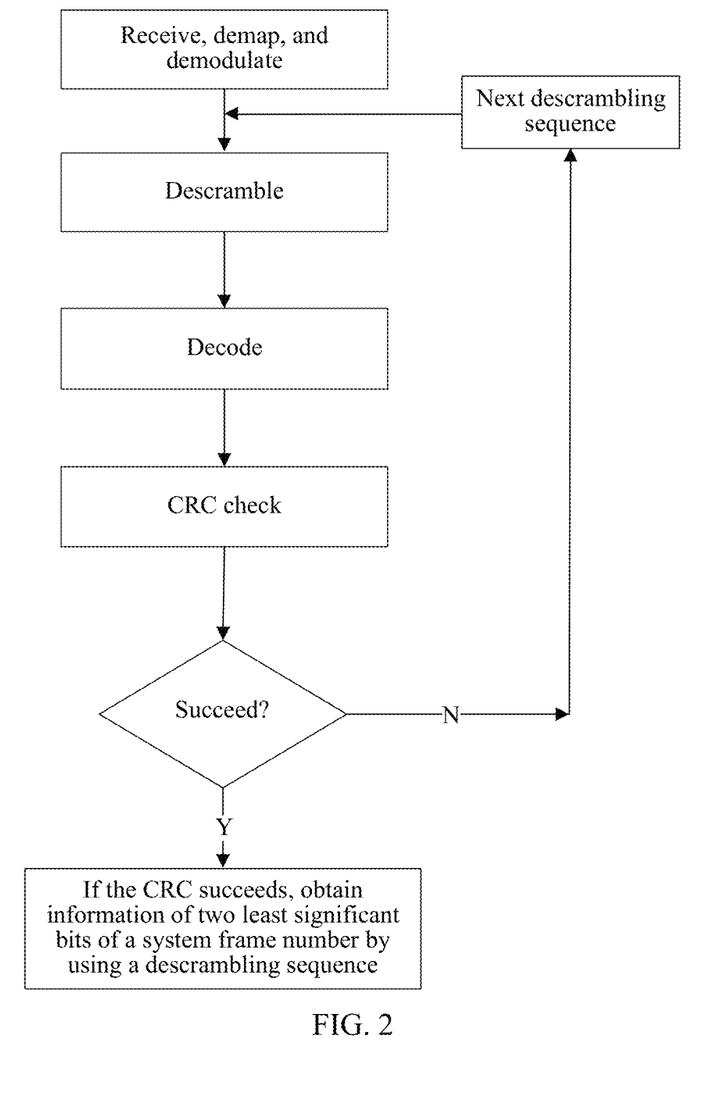
FIG. 2 shows a processing process of a PBCH at a receive end in LTE.

A processing process of a PBCH at a receive end is shown in FIG. 2. It may be learned from the descriptions of the transmit end that the four PBCH independent units carry the same encoded bits. Therefore, when channel quality is sufficiently good, operations of descrambling, decoding, and CRC check can be successfully completed when only one PBCH independent unit within 40 ms is received at the receive end. Because the receive end learns, by using a scrambling code sequence that is successfully descrambled, of a number of a radio frame within 40 ms on which the MIB is sent at the transmit end, the receive end learns of two least significant bits of the SFN.

When the channel quality is relatively poor, descrambling and decoding cannot be successfully performed if only one PBCH independent unit is received at the receive end. Therefore, soft combination is performed on the PBCH independent unit and a PBCH independent unit sent in a next 10 ms and then decoding is performed, until decoding succeeds.

Three major types of scenarios are defined in a 5th generation (5G) communications system and more possible subsequent communications systems. The scenarios are enhanced mobile broadband (eMBB), ultra-reliable and low-latency communications (URLLC), and massive machine type communications (mMTC). eMBB services mainly include ultra high definition videos, augmented reality AR, virtual reality VR, and the like, and are mainly characterized by a large volume of transmitted data and a very high transmission rate. URLLC services are mainly applied to industry control, unmanned driving, and the like in the internet of things, and are mainly characterized by ultrahigh reliability, a low latency, a relatively small volume of transmitted data, and burstiness. mMTC services are mainly applied to a smart grid, a smart city, and the like in the internet of things, and are mainly characterized by massive device connections, a small volume of transmitted data, and tolerance of a relatively high latency.

In the 3GPP (3rd Generation Partnership Project) RAN1 (Radio Access Network) #87 conference, a polar code is formally accepted as a channel coding solution of uplink and downlink control channels in a 5G eMBB scenario. There is room for improvement of applying the polar code to the channel coding on the PBCH.

SUMMARY

In view of this, a main objective of this application is to provide a transmission method, a transmission apparatus, and a communications device, to improve encoding and decoding performance of a polar code.

According to a first aspect, this application provides a transmission method. The method is applied to a network device and includes: performing polar encoding on a bit sequence, to obtain an encoded sequence, where the bit sequence includes control information and a cyclic redundancy check CRC sequence; fragmenting the encoded sequence, to obtain n encoded subsequences, where n is an integer, and n>0; scrambling the n encoded subsequences by using n scrambling sequences respectively, to obtain n scrambled sequences; and performing modulation and mapping operations on the n scrambled sequences, and sending the n scrambled sequences after the modulation and mapping.

According to a second aspect, this application provides a transmission apparatus. The apparatus includes: an encoding unit, configured to perform polar encoding on a bit sequence, to obtain an encoded sequence, where the bit sequence includes control information and a cyclic redundancy check CRC sequence; a rate matching unit, configured to fragment the encoded sequence, to obtain n encoded subsequences, where n is an integer, and n>0; a scrambling unit, configured to scramble the n encoded subsequences by using n scrambling sequences respectively, to obtain n scrambled sequences; a processing unit, configured to perform modulation and mapping operations on the n scrambled sequences; and a sending unit, configured to send the n scrambled sequences after the modulation and mapping.

With reference to the first aspect and the second aspect, in a possible design, the scrambling the n encoded subsequences by using n scrambling sequences respectively specifically includes: performing an exclusive-OR operation on an odd-numbered vector and an even-numbered vector of each of the n encoded subsequences by using each of the n scrambling sequences.

With reference to the first aspect and the second aspect, in a possible design, the n scrambling sequences carry $\lceil \log_2 n \rceil$-bit information.

With reference to the first aspect and the second aspect, in a possible design, the control information is a master information block MIB.

According to a third aspect, this application provides a communications device. The communications device includes: a memory, configured to store a program; a processor, configured to execute the program stored in the memory, where when the program is executed, the processor performs polar encoding on a bit sequence, to obtain an encoded sequence, where the bit sequence includes control information and a cyclic redundancy check CRC sequence; fragments the encoded sequence, to obtain n encoded subsequences, where n is an integer, and n>0; scrambles the n encoded subsequences by using n scrambling sequences respectively, to obtain n scrambled sequences; and performs modulation and mapping operations on the n scrambled sequences, and a transceiver, configured to send the n scrambled sequences after the modulation and mapping.

According to a fourth aspect, this application provides a computer readable storage medium. The computer readable storage medium includes an instruction. When the instruction is run on a computer, the computer is enabled to perform the decoding method according to the first aspect.

According to a fifth aspect, this application provides a transmission method. The method is applied to a terminal, and includes: receiving, by the terminal, a symbol sequence, where the symbol sequence is obtained by a network device after the network device encodes control information by using a polar code, and scrambles, modulates, and maps encoded control information; demapping and demodulating, by the terminal, the symbol sequence, to obtain an encoded sequence; selecting, by the terminal, at least one encoded subsequence from the encoded sequence; performing, by the terminal, polar decoding on the at least one encoded subsequence, to obtain a bit sequence, where the bit sequence includes the control information and a CRC sequence; and performing, by the terminal, a descrambling operation on the bit sequence by using at least one descrambling sequence, and performing CRC check on a descrambled bit sequence, to obtain the control information and timing information if the CRC check succeeds.

According to the fifth aspect, this application provides a transmission apparatus. The transmission apparatus includes: a receiving unit, configured to receive a symbol sequence, where the symbol sequence is obtained by a network device after the network device encodes control information by using a polar code, and scrambles, modulates, and maps encoded control information; a processing unit, configured to demap and demodulate the symbol sequence, to obtain an encoded sequence, and further configured to select at least one encoded subsequence from the encoded sequence; a decoding unit, configured to perform polar decoding on the at least one encoded subsequence, to obtain a bit sequence, where the bit sequence includes the control information and a CRC sequence; a descrambling unit, configured to perform a descrambling operation on the bit sequence by using at least one descrambling sequence; and a check unit, configured to perform CRC check on a descrambled bit sequence, to obtain the control information and timing information if the CRC check succeeds.

According to a sixth aspect, this application provides a transmission apparatus. The transmission apparatus includes: a receiving unit, configured to receive a symbol sequence, where the symbol sequence is obtained by a network device after the network device encodes control information by using a polar code, and scrambles, modulates, and maps encoded control information; a processing unit, configured to demap and demodulate the symbol sequence, to obtain an encoded sequence, and further configured to select at least one encoded subsequence from the encoded sequence; a decoding unit, configured to perform polar decoding on the at least one encoded subsequence, to obtain a bit sequence, where the bit sequence includes the control information and a CRC sequence; a descrambling unit, configured to perform a descrambling operation on the bit sequence by using at least one descrambling sequence; and a check unit, configured to perform CRC check on a descrambled bit sequence, to obtain the control information and timing information if the CRC check succeeds.

With reference to the fifth aspect and the sixth aspect, in a possible design, the performing, by the terminal, polar decoding on the at least one encoded subsequence specifically includes: decoding, by the terminal, one encoded subsequence; and the performing, by the terminal, a descrambling operation on the bit sequence by using at least one descrambling sequence, and performing CRC check on a descrambled bit sequence specifically includes: performing, by the terminal, a descrambling operation on the bit sequence by using each of four descrambling sequences, and performing CRC check on a descrambled bit sequence obtained each time, to obtain the control information if the CRC check succeeds; and obtaining, by the terminal, the timing information based on a sequence number of a descrambling sequence corresponding to the successful CRC check.

With reference to the fifth aspect and the sixth aspect, in a possible design, the performing, by the terminal, polar decoding on the at least one encoded subsequence specifically includes:

performing, by the terminal, soft combination on two encoded subsequences, to obtain a soft-combined sequence; and performing polar decoding on the soft-combined sequence; and the performing, by the terminal, a descrambling operation on the bit sequence by using at least one descrambling sequence, and performing CRC check on a descrambled bit sequence specifically includes:

performing, by the terminal, a descrambling operation on the bit sequence by using each of two descrambling sequences, and performing CRC check on a descrambled bit sequence obtained each time, to obtain the control information if the CRC check succeeds; and obtaining, by the terminal, the timing information based on a sequence number of a descrambling sequence corresponding to the successful CRC check.

With reference to the fifth aspect and the sixth aspect, in a possible design, the control information is a master information block MIB.

According to a seventh aspect, this application provides a communications device. The communications device includes: a memory, configured to store a program; a transceiver, configured to receive a symbol sequence, where the symbol sequence is obtained by a network device after the network device encodes control information by using a polar code, and scrambles, modulates, and maps encoded control information; and a processor, configured to execute the program stored in the memory, where when the program is executed, the processor demaps and demodulates the symbol sequence, to obtain an encoded sequence; selects at least one encoded subsequence from the encoded sequence; performs polar decoding on the at least one encoded subsequence, to obtain a bit sequence, where the bit sequence includes the control information and a CRC sequence; and performs a descrambling operation on the bit sequence by using at least one descrambling sequence, and performs CRC check on a descrambled bit sequence, to obtain the control information and timing information if the CRC check succeeds.

According to an eighth aspect, this application provides a computer readable storage medium. The computer readable storage medium includes an instruction. When the instruction is run on a computer, the computer is enabled to perform the decoding method according to the fifth aspect.

In the embodiments, the n scrambling sequences are newly defined based on encoding and decoding features of the polar code, and the n scrambling sequences additionally carry the $\lceil \log_2 n \rceil$-bit information. According to the foregoing encoding method, signaling overheads are reduced. On a receive side, polar decoding is first performed on an LLR subsequence, and then the LLR subsequence is descrambled, so that a quantity of decoding times is reduced, and implementation complexity is reduced.

DESCRIPTION OF EMBODIMENTS

The following further describes specific embodiments of this application in detail with reference to accompanying drawings.

Figure 3:
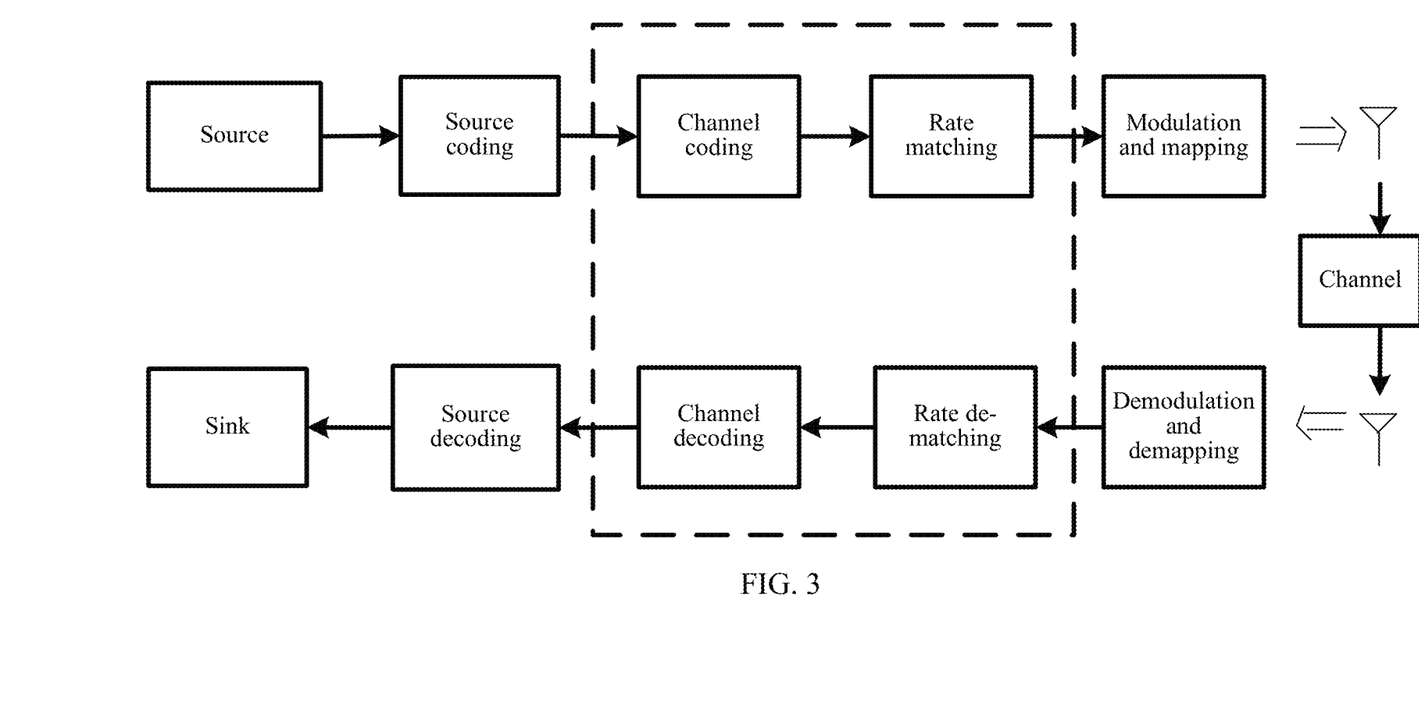
FIG. 3 is a basic flowchart of wireless communication.

FIG. 3 shows a basic procedure of wireless communication. At a transmit end, a source is sent after source coding, channel coding, rate matching, and modulation and mapping are sequentially performed on the source. At a receive end, the source undergoes demodulation and de-mapping, rate de-matching, channel decoding, and source decoding sequentially, and then a sink is output. A polar code may be used for the channel coding and decoding. A code length of an original polar code (a mother code) is an integer power of 2. Therefore, during actual application, a polar code of any code length needs to be implemented through rate matching. At the transmit end, the rate matching is performed after the channel coding, to implement any target code length. At the receive end, the rate de-matching is performed before the channel decoding. It should be noted that in addition to the basic procedure, the wireless communication further includes additional procedures (for example, precoding and interleaving). In view of that the additional procedures are common general knowledge for a person skilled in the art, examples are not listed one by one. A CRC sequence and CRC information that are mentioned in this application are different names of a same object.

Figure 4:
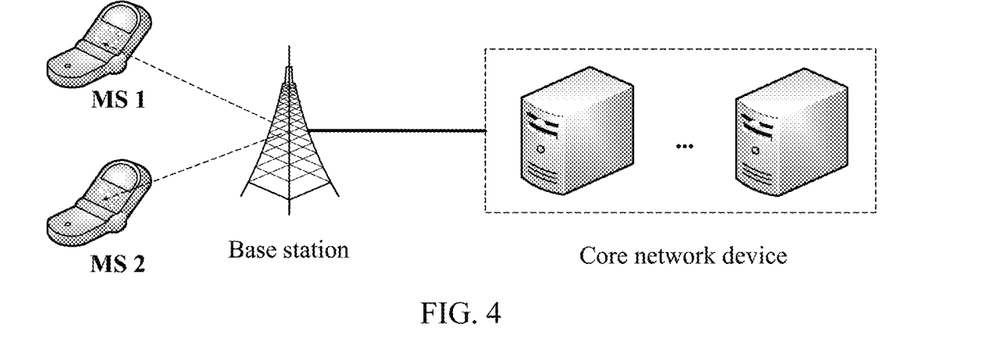
FIG. 4 is a diagram of an application scenario according to an embodiment of this application.

The embodiments of this application may be applied to a wireless communications system. The wireless communications system usually includes cells. Each cell includes a base station (BS), and the base station provides a communications service for a plurality of mobile stations (MS). As shown in FIG. 4, the base station is connected to core network devices. The base station includes a BBU (Baseband Unit) and an RRU (Remote Radio Unit). The BBU and the RRU may be placed at different places. For example, the RRU is remotely installed and is placed in an area having a high traffic volume, and the BBU is placed in a central equipment room. Alternatively, the BBU and the RRU may be placed in a same equipment room. Alternatively, the BBU and the RRU may be different components under a same rack.

It should be noted that the wireless communications system mentioned in the embodiments of this application includes but is not limited to: a narrow band internet of things (NB-IoT) system, a global system for mobile communications (GSM) system, an enhanced data rates for GSM evolution (EDGE) system, a wideband code division multiple access (WCDMA) system, a code division multiple access 2000 (CDMA 2000) system, a time division-synchronous code division multiple access (TD-SCDMA) system, a long term evolution (LTE) system, and three major application scenarios, namely, eMBB, URLLC, and eMTC, of a next-generation 5G mobile communications system.

In the embodiments of this application, the base station is an apparatus that is deployed in a radio access network and that provides a wireless communication function for the MS. The base station may include various forms of macro base stations, micro base stations (also referred to as small cells), relay stations, access points, and the like. A device with a base station function may have different names in systems that use different radio access technologies. For example, in the LTE system, the device is referred to as an evolved NodeB (eNB or eNodeB); and in a 3rd generation (3G) system, the device is referred to as a NodeB. For ease of description, in all the embodiments of this application, the foregoing apparatuses that provide the wireless communication function for the MS are collectively referred to as a base station or a BS.

The MS in the embodiments of this application may include a handheld device, an in-vehicle device, a wearable device, or a computing device that has the wireless communication function, or another processing device connected to a wireless modem. The MS may also be referred to as a terminal. The MS may alternatively include a subscriber unit, a cellular phone, a smartphone, a wireless data card, a personal digital assistant (PDA) computer, a tablet computer, a wireless modem, a handset, a laptop computer, a machine type communication (MTC) terminal, or the like. For ease of description, the devices mentioned above are collectively referred to as the MS in embodiments of this application.

The following briefly describes the polar code.

In a communications system, channel coding is usually performed to improve reliability of data transmission, to ensure quality of communication. The polar code proposed by the Turkish processor Arikan is a code that is first theoretically proved to be capable of achieving a Shannon capacity and that has low encoding and decoding complexity.

The polar code is also a linear block code. An encoding matrix of the polar code is $G_N$. An encoding process is $x_1^N = u_1^N G_N$.

$u_1^N = (u_1, u_2, \ldots u_N)$ is a binary row vector, and has a length of N (namely, a code length). $G_N$ is an N×N matrix, and $G_N = F_2^{\otimes(log_2(N))}$. $F_2^{\otimes(log_2(N))}$ is defined as a Kronecker (Kronecker) product of $log_2$ N matrices $F_2$.

The foregoing matrix $$F_2 = \begin{bmatrix} 1 & 0 \\ 1 & 1 \end{bmatrix}.$$

In the encoding process of the polar code, some bits in $u_1^N$ are used to carry information, and are referred to as an information bit set. A set of indexes of the bits is denoted by A. The other bits are set to fixed values pre-agreed by a transceiver end, and are referred to as a fixed bit set or a frozen bit set (frozen bits). A set of indexes of the bits is represented by a complementary set $A^C$ of A. The encoding process of the polar code is equivalent to: $x_1^N = u_A G_N(A) \oplus u_{A^c} G_N(A^C)$. Herein, $G_N(A)$ is a submatrix obtained by using rows corresponding to the indexes in the set A in $G_N$, and $G_N(A^C)$ is a submatrix obtained by using rows corresponding to the indexes in the set $A^C$ in $G_N$. $u_A$ is the information bit set in $u_1^N$, and a quantity of information bits is K. $u_{A^c}$ is the fixed bit set in $u_1^N$, a quantity of fixed bits is (N−K), and the fixed bits are known bits. The fixed bits are usually set to 0. However, the fixed bits may be randomly set, provided that the fixed bits are pre-agreed by the transceiver end. In this way, an encoded output of the polar code may be simplified as: $x_1^N = u_A G_N(A)$. Herein, $u_A$ is the information bit set in $u_1^N$, and $u_A$ is a row vector having a length of K. In other words, |A|=K. |•| represents a quantity of elements in a set, K is a size of an information block, $G_N(A)$ is the submatrix obtained by using the rows corresponding to the indexes in the set A in the matrix $G_N$, and $G_N(A)$ is a K×N matrix.

A construction process of the polar code is a selection process of the set A, and determines performance of the polar code. The construction process of the polar code is usually: determining, based on a code length N of a mother code, that there are N polarized channels in total that correspond to N rows of the encoding matrix respectively, calculating reliability of the polarized channels, using indexes of first K polarized channels having relatively high reliability as elements in the set A, and using indexes corresponding to remaining (N−K) polarized channels as elements in the set $A^C$ of the indexes of the fixed bits. The set A determines locations of the information bits, and the set $A^C$ determines locations of the fixed bits.

It may be learned from the encoding matrix that the code length of an original polar code (the mother code) is an integer power of 2. During actual application, a polar code of any code length needs to be implemented through rate matching.

To improve the performance of the polar code, usually, check precoding is first performed on the information bit set, and then polar encoding is performed. There are two common check precoding manners, namely, CRC (Cyclic Redundancy Check) concatenated polar encoding or PC (Parity Check) concatenated polar encoding. Currently, the polar encoding includes: conventional Arikan polar encoding, CA polar encoding, and PC polar encoding. A polar encoding and decoding method and a polar encoding and decoding apparatus in this application may use the conventional polar encoding, the CA polar encoding, or the PC polar encoding.

Figure 5:
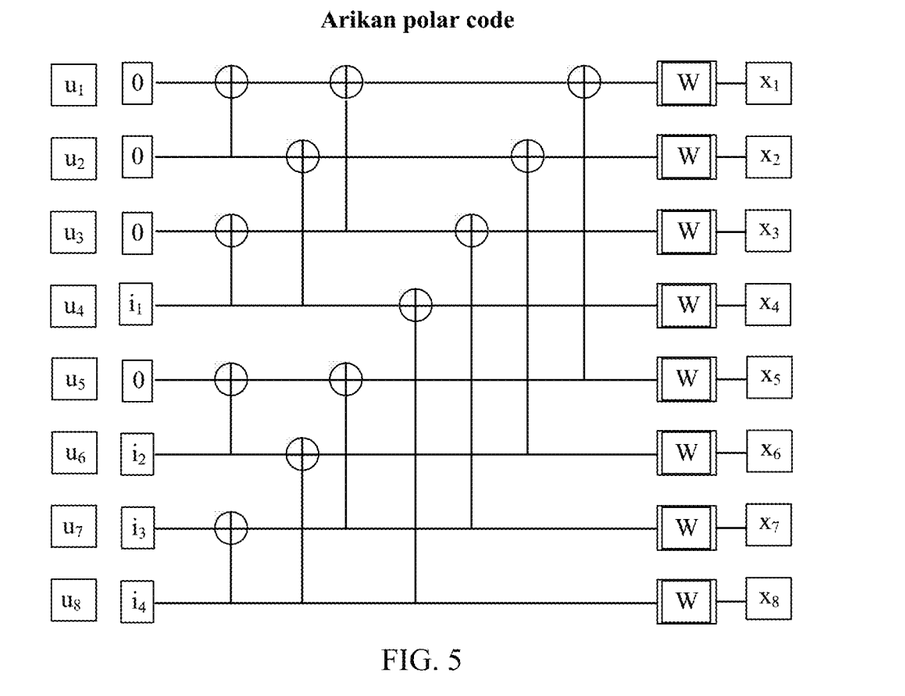
FIG. 5 is a diagram of construction of an Arikan polar code.

Conventional Arikan polar encoding in FIG. 5 is described. {u1, u2, u3, u5} is set to be a fixed bit set, {u4, u6, u7, u8} is set to be an information bit set, and four information bits in an information vector having a length of four are encoded into eight encoded bits.

Figure 6:
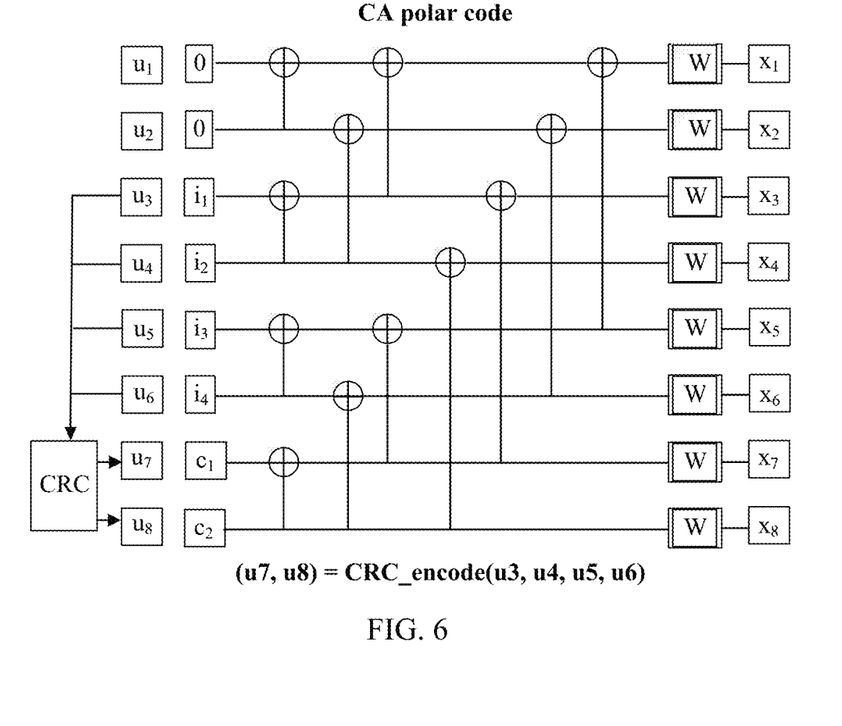
FIG. 6 is a diagram of construction of a CA polar code.

CA polar encoding in FIG. 6 is described. {u1, u2} is set to be a fixed bit set, {u3, u4, u5, u6} is set to be an information bit set, and {u7, u8} is a CRC bit set. Values of {u7, u8} are obtained by performing CRC on {u3, u4, u5, u6}.

For the CA polar encoding, a CA-SCL (CRC-Aided Successive Cancellation List) decoding algorithm is used. Through the CA-SCL decoding algorithm, a path on which CRC succeeds is selected, as a decoded output through CRC check, from candidate paths of an SCL decoded output.

Figure 7:
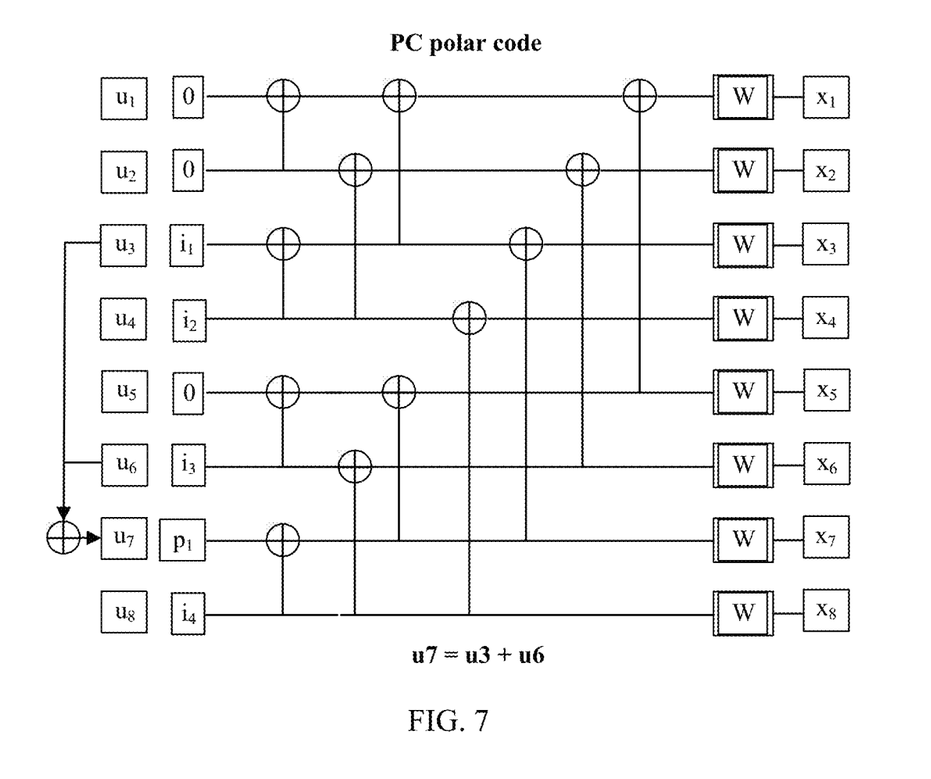
FIG. 7 is a diagram of construction of a PC polar code.

PC polar encoding in FIG. 7 is described. {u1, u2, u5} is set to be a fixed bit set, {u3, u4, u6, u7} is set to be an information bit set, and {u7} is a PC fixed bit set. A value of {u7} is obtained by performing exclusive-OR on {u3, u6}.

Figure 8:
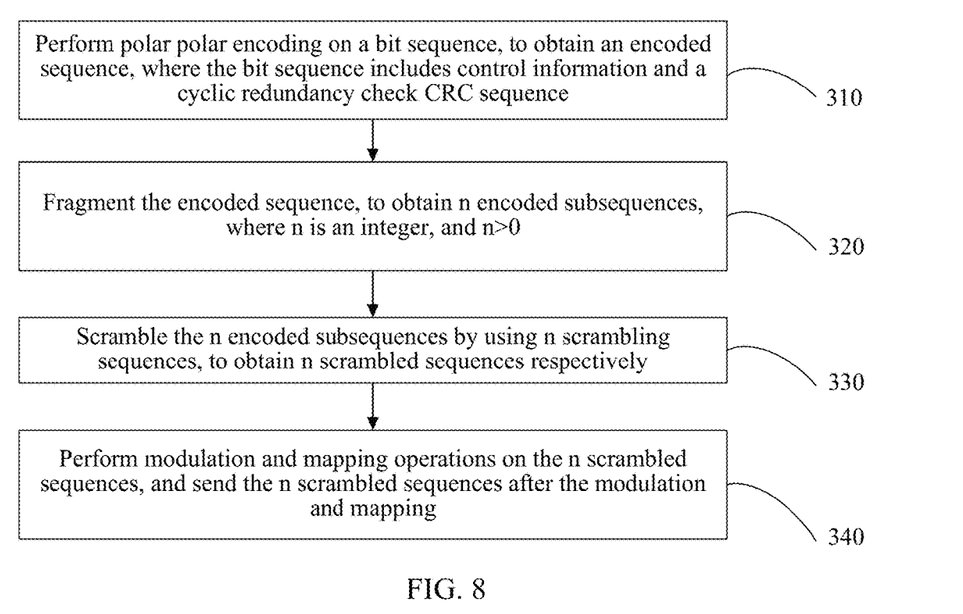
FIG. 8 is a flowchart of a transmit side according to an embodiment of this application.

This application provides a transmission method. The transmission method may be applied to a network device, for example, the base station in FIG. 4. FIG. 8 is a flowchart of the transmission method. Specific steps are as follows.

Step 310: Perform polar polar encoding on a bit sequence, to obtain an encoded sequence, where the bit sequence includes control information and a cyclic redundancy check CRC sequence.

Step 320: Fragment the encoded sequence, to obtain n encoded subsequences, where n is an integer, and n>0.

Step 330: Scramble the n encoded subsequences by using n scrambling sequences, to obtain n scrambled sequences respectively.

Step 340: Perform modulation and mapping operations on the n scrambled sequences, and send the n scrambled sequences after the modulation and mapping.

It should be noted that the bit sequence in step 310 is a to-be-encoded vector of polar. Steps 310 and 330 may be exchanged. According to the transmission method in this application, the bit sequence may be encoded and fragmented first and then scrambled, or the bit sequence may be scrambled and fragmented first and then encoded.

Figure 9:
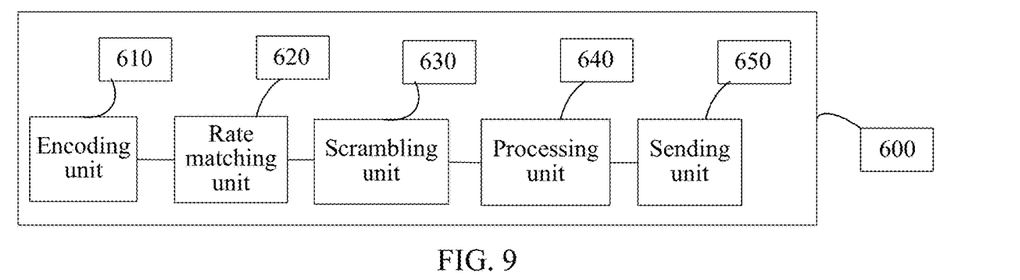
FIG. 9 is a structural diagram of a virtual apparatus at a transmit end according to an embodiment of this application.

It should be noted that a transmission apparatus 600 shown in FIG. 9 can implement processes such as step 310 to step 340. An encoding unit 610 is configured to perform step 310. A rate matching unit 620 is configured to perform step 320. A scrambling unit 630 is configured to perform the scrambling process in step 330. A processing unit 640 is configured to perform the modulation and mapping processes in step 340. A sending unit 650 is configured to perform the process of sending the n modulated and mapped scrambled sequences in step 340. The transmission apparatus is, for example, a base station BS or a mobile station MS. The transmission apparatus may alternatively be an application-specific integrated circuit (ASIC), a digital signal processor (DSP), or a chip that implements a related function.

It should be noted that the n scrambled sequences are sent in different timings after the modulation and mapping operations. A value of n includes the following implementations.

Implementation 1 (n=2): The following content is described based on the step of scrambling and fragmenting first and then encoding. Based on a polar encoding matrix, if any bit in a bit sequence u is inverted, a corresponding bit in an encoded subsequence x is inverted. Assuming that the last bit in u is inverted, x becomes −x. This is equivalent to:

$$u \cdot G_n = x \Rightarrow y$$

$$(u+p) \cdot G_n = -x \Rightarrow -y.$$

p is a vector in which the last element is 1 and the other elements are all 0, and may be understood as a scrambling sequence. In this application, p and 0 are both vectors having a length of N, where N is a length of a mother code of the polar code. A location of the element that is 1 in p is a location of an information bit in the to-be-encoded vector u of polar.

Based on the foregoing encoding feature, the network device separately sends x and −x in two timings, and adds one-bit timing information.

Implementation 2 (n=4):

It should be noted that a specific process of step 330 is as follows: An exclusive-OR operation is performed on an odd-numbered vector and an even-numbered vector of each of the four encoded subsequences by using each of the four scrambling sequences.

In an example for description, it is assumed that one of the four encoded subsequences is x and has a length of N, an even-numbered vector of the sequence x is $x_0$, and an odd-numbered vector of the sequence x is $x_1$. $x_0 = \{x(0), x(2) \ldots, x(N-2)\}$, and $x_1 = \{x(1), x(3) \ldots, x(N-1)\}$.

The four scrambling sequences are [0, 0], [1, 1], [0, 1], and [1, 0]. A length of each scrambling sequence is N, the first coefficient in [ ] represents an even-numbered vector in N elements, and the second coefficient in [ ] represents an odd-numbered vector in the N elements. A scrambling process of the encoded subsequence x by using the four scrambling sequences are shown in the following formulas:

$$u + p_0 \leftrightarrow [x_0, x_1] + [0, 0] = [x_0, x_1] \Rightarrow [y_0, y_1],$$

$$u + p_1 \leftrightarrow [x_0, x_1] + [0, 1] = [x_0, -x_1] \Rightarrow [y_0, -y_1],$$

$$u + p_2 \leftrightarrow [x_0, x_1] + [1, 1] = [-x_0, -x_1, ] \Rightarrow [-y_0, -y_1]$$

$$u + p_3 \leftrightarrow [x_0, x_1] + [1, 0] = [-x_0, x_1] \Rightarrow [-y_0, y_1]$$

$p_0$, $p_1$, $p_2$, and $p_3$ are scrambling sequences before encoding. In this application, [0, 0], [0, 1], [1, 1], and [1, 0] are scrambling sequences after encoding. First scrambling the bit sequence by using $p_0$, $p_1$, $p_2$, and $p_3$ and then encoding the bit sequence achieves a same technical effect as that of first encoding the bit sequence and then scrambling the bit sequence by using [0, 0], [0, 1], [1, 1], and [1, 0].

$p_0$, $p_1$, $p_2$, and $p_3$ are respectively:

$p_0 = [0 \ldots 0\ 0]$,
$p_1 = [0 \ldots 1\ 1]$,
$p_2 = [0 \ldots 0\ 1]$,
$p_3 = [0 \ldots 1\ 0]$ u is the bit sequence in step 310. Inverting values of any two bits in u is equivalent to separately adding a scrambling vector to u, and the scrambling vector is denoted by $p_0$, $p_1$, $p_2$, and $p_3$. Corresponding symbol inversion is presented after corresponding encoding. In this application, a bit that is 1 in each of $p_0$, $p_1$, $p_2$, and $p_3$ is a location of an information bit in the to-be-encoded vector of polar. In addition, inverting two bits correspondingly generates four cases, to cause the network device to additionally add two-bit timing information to the sent scrambled sequences.

It should be noted that for a set $\{P_i\}$ (i=0, 1, 2, . . . , and n) of a plurality of scrambling vectors in a plurality of timings, in addition to the examples provided in Implementation 1 (n=2) and Implementation 2 (n=4), another implementation is further included, provided that the implementation satisfies the following conditions:

(1) Different timings correspond to different scrambling vectors $P_i$.

(2) An element that is 1 in a vector $P_i$ only appears at the location of the information bit in the to-be-encoded vector u of polar.

(3) MIB information carried in a PBCH and CRC are serialized according to a rule to form $u_A$. $u_A$ is the information bit in the to-be-encoded vector of polar. CRC check on $u_A$ can succeed after $u_A$ is deserialized according to the rule. CRC check cannot succeed after any $p_{iA}$ is deserialized according to the rule. $p_{iA}$ is a bit that is in the vector $P_i$ and that is located at the location of the information bit.

Optionally, the control information in step 310 is a master information block MIB.

Optionally, the four scrambling sequences carry two-bit information. The two-bit information may be two least significant bit information in a system frame number (SFN).

Figure 10:
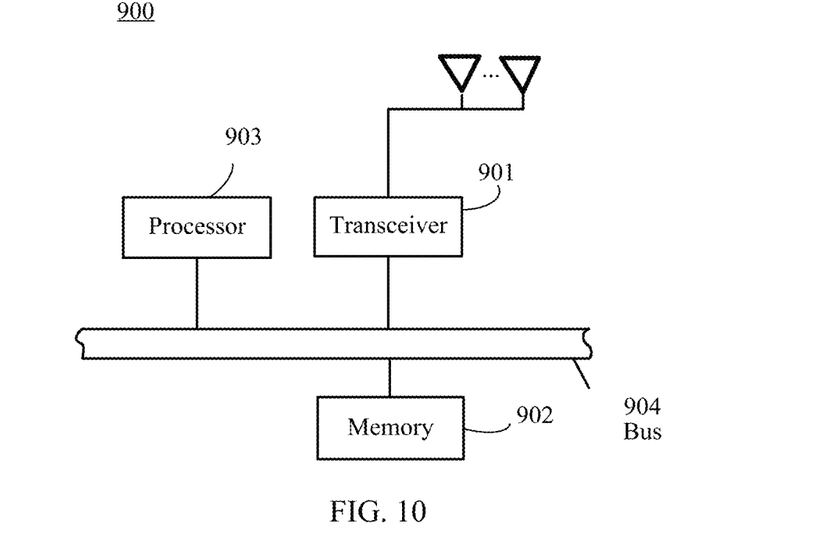
FIG. 10 is a structural diagram of a physical apparatus at a transmit end according to an embodiment of this application.

As shown in FIG. 10, this application further provides a communications device 900. The communications device may be a base station, a terminal, or a DSP, an ASIC, or a chip that implements a related decoding function. The communications device 900 includes:

a memory 902, configured to store a program, where the memory may be a RAM (Random Access Memory), a ROM (Read Only Memory), or a flash, and the memory may be separately located in the communications device, or may be located inside a processor 903;

the processor 903, configured to execute the program stored in the memory, where when the program is executed, the processor performs polar encoding on a bit sequence, to obtain an encoded sequence, where the bit sequence includes control information and a cyclic redundancy check CRC sequence; fragments the encoded sequence, to obtain n encoded subsequences, where n is an integer, and n>0; scrambles the n encoded subsequences by using n scrambling sequences respectively, to obtain n scrambled sequences; and performs modulation and mapping operations on the n scrambled sequences, and a transceiver 901, configured to send the n scrambled sequences after the modulation and mapping.

The transceiver 901, the memory 902, and the processor 903 are connected via a bus 904.

It should be noted that the method performed by the processor is consistent with the foregoing content. Details are not described again.

In this embodiment, the n scrambling sequences are newly defined based on encoding and decoding features of a polar code, and the n scrambling sequences additionally carry $\lceil \log_2 n \rceil$-bit information. According to the foregoing encoding method, signaling overheads are reduced.

Figure 11:
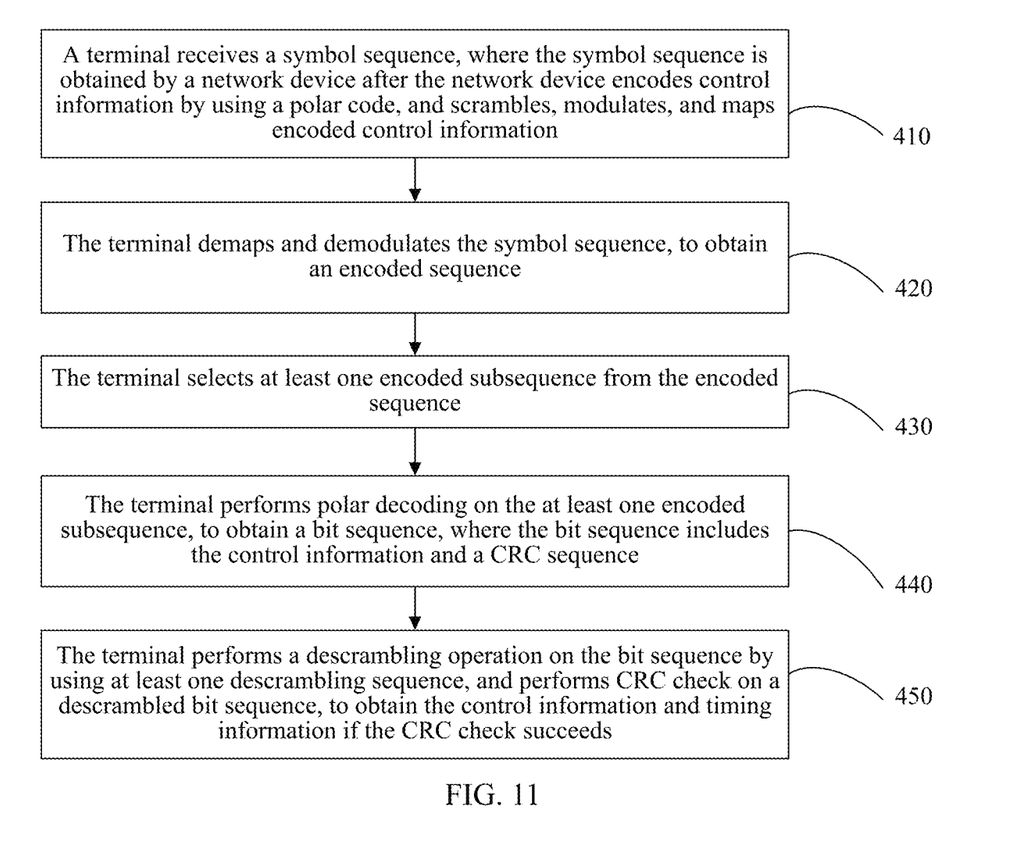
FIG. 11 is a flowchart of a receive side according to an embodiment of this application.

This application provides a transmission method. The transmission method may be applied to a terminal device, for example, an MS 1 and an MS 2 in FIG. 4. FIG. 11 is a flowchart of the transmission method. Specific steps are as follows.

Step 410: The terminal receives a symbol sequence, where the symbol sequence is obtained by a network device after the network device encodes control information by using a polar code, and scrambles, modulates, and maps encoded control information.

Step 420: The terminal demaps and demodulates the symbol sequence, to obtain an encoded sequence.

Step 430: The terminal selects at least one encoded subsequence from the encoded sequence.

Step 440: The terminal performs polar decoding on the at least one encoded subsequence, to obtain a bit sequence, where the bit sequence includes the control information and a CRC sequence.

Step 450: The terminal performs a descrambling operation on the bit sequence by using at least one descrambling sequence, and performs CRC check on a descrambled bit sequence, to obtain the control information and timing information if the CRC check succeeds.

Figure 12:
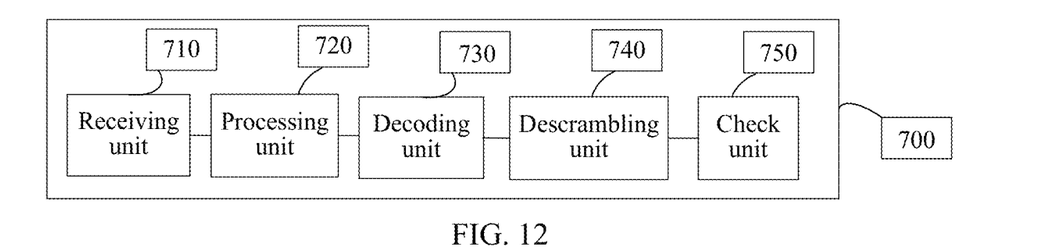
FIG. 12 is a structural diagram of a virtual apparatus at a receive end according to an embodiment of this application.

It should be noted that a transmission apparatus 700 shown in FIG. 12 can implement processes such as step 410 to step 450. A receiving unit 710 is configured to perform step 410. A processing unit 720 is configured to perform step 420 and step 430. A decoding unit 730 is configured to perform the decoding process in step 440. A descrambling unit 740 is configured to perform the descrambling process in step 450. A check unit 750 is configured to perform the check process in step 450. The transmission apparatus is, for example, a mobile station MS or a base station BS. The transmission apparatus may alternatively be an application-specific integrated circuit (ASIC), a digital signal processor (DSP), or a chip that implements a related function.

It should be noted that step 430 to step 450 include at least the following implementations. In step 430, a quantity of encoded subsequences selected by the terminal is 1 to 4. Implementation 1 and Implementation 2 are for a case in which there are two descrambling sequences, and Implementation 3 and Implementation 4 are for a case in which there are four descrambling sequences.

Implementation 1: The terminal decodes one encoded subsequence; the terminal performs a descrambling operation on the bit sequence by using each of the two descrambling sequences, and performs CRC check on a descrambled bit sequence obtained each time, to obtain the control information if the CRC check succeeds; and the terminal obtains the timing information based on a sequence number of a descrambling sequence corresponding to the successful CRC check.

In an example for description, a receive end receives y or −y. Regardless of whether y or −y is received, the receive end may perform decoding first, then perform descrambling operations separately by using 0 and p, and test whether CRC succeeds, to determine whether y or −y is actually received.

Implementation 2: The terminal receives two LLR subsequences, performs soft combination, and then performs decoding. The terminal separately performs a descrambling operation on a decoded result by using 0 and p, and whether CRC succeeds is tested, to determine whether y or −y is input into a decoder.

Implementation 3: The terminal decodes one encoded subsequence; the terminal performs a descrambling operation on the bit sequence by using each of the four descrambling sequences, and performs CRC check on a descrambled bit sequence obtained each time, to obtain the control information if the CRC check succeeds; and the terminal obtains the timing information based on a sequence number of a descrambling sequence corresponding to the successful CRC check.

It should be supplemented that the encoded subsequence is an LLR (Log Likelihood Ratio) subsequence. The terminal performs polar decoding on the encoded subsequence, to obtain the bit sequence. The terminal continues to separately descramble the bit sequence by using four descrambling sequences $p_0$, $p_1$, $p_2$, and $p_3$, then performs CRC check, and performs descrambling and CRC check operations in a next round if the CRC check does not succeed. Therefore, a maximum quantity of CRC check times is 4, and a minimum quantity of check times is 1. The four descrambling sequences carry two-bit timing information. The terminal obtains the timing information based on the sequence number of the descrambling sequence corresponding to the successful CRC check.

Implementation 4: The terminal performs soft combination on two encoded subsequences, to obtain a soft-combined sequence; the terminal performs polar decoding on the soft-combined sequence, to obtain the bit sequence; the terminal separately performs a descrambling operation on the bit sequence by using two descrambling sequences, and performs CRC check on a descrambled bit sequence obtained each time, to obtain the control information if the CRC check succeeds; and the terminal obtains the timing information based on a sequence number of a descrambling sequence corresponding to the successful CRC check.

It should be supplemented that the encoded subsequence is an LLR subsequence. It is assumed that the terminal receives two LLR subsequences. An operation of blind detection 1 is first performed. In the blind detection 1, the two LLR subsequences received by the terminal may include the second or the fourth LLR subsequence. The terminal negates odd-numbered bits of a previous LLR subsequence, performs soft combination on the previous LLR subsequence and a current LLR subsequence, then performs polar decoding, performs descrambling by using sequences $p_1$ and $p_3$, and then separately performs CRC check, to determine whether the two LLR subsequences are in a timing assumed in the current blind detection operation.

An operation of blind detection 2 is then performed. In the blind detection 2, the LLR subsequences received by the terminal may include the third LLR subsequence. In this case, the terminal negates even-numbered bits of the previous LLR subsequence, performs soft combination on the previous LLR subsequence and the current LLR subsequence, then performs polar decoding, performs descrambling by using a sequence $p_2$, and performs CRC check, to determine whether the two LLR subsequences are in the timing assumed in the current blind detection operation.

It may be learned from the foregoing blind detection processes that if the terminal receives two encoded subsequences, polar decoding needs to be performed twice, and CRC check needs to be performed for three times, to obtain the control information and the timing information.

Optionally, the control information in step 440 is a master information block MIB.

Figure 13:
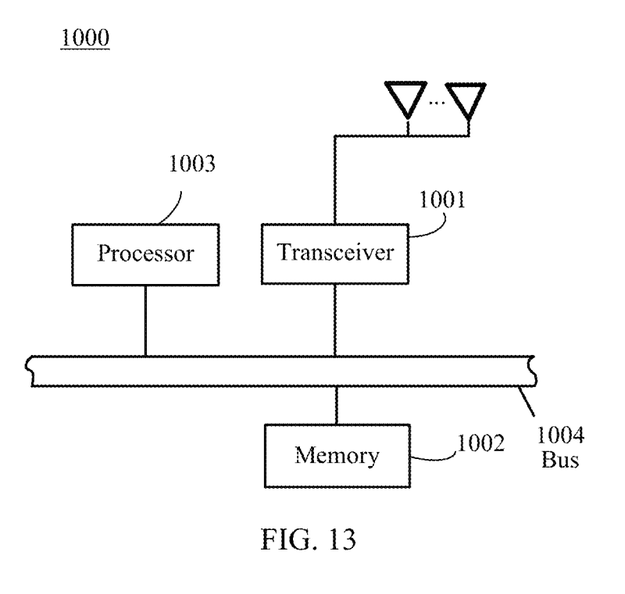
FIG. 13 is a structural diagram of a physical apparatus at a receive end according to an embodiment of this application.

As shown in FIG. 13, this application further provides a communications device 1000. The communications device may be a base station, a terminal, or a DSP, an ASIC, or a chip that implements a related decoding function. The communications device 1000 includes: a memory 1002, configured to store a program, where the memory may be a RAM (Random Access Memory), a ROM (Read Only Memory), or a flash, and the memory may be separately located in the communications device, or may be located inside a processor 1003; a transceiver 1001, configured to receive a symbol sequence, where the symbol sequence is obtained by a network device after the network device encodes control information by using a polar code, and scrambles, modulates, and maps encoded control information; and the processor 1003, configured to execute the program stored in the memory, where when the program is executed, the processor demaps and demodulates the symbol sequence, to obtain an encoded sequence; selects at least one encoded subsequence from the encoded sequence; performs polar decoding on the at least one encoded subsequence, to obtain a bit sequence, where the bit sequence includes the control information and a CRC sequence; and performs a descrambling operation on the bit sequence by using at least one descrambling sequence, and performs CRC check on a descrambled bit sequence, to obtain the control information and timing information if the CRC check succeeds.

The transceiver 1001, the memory 1002, and the processor 1003 are connected via a bus 904.

In this embodiment, based on encoding and decoding features of the polar code, on a receive side, polar decoding is first performed on an LLR subsequence, and then the LLR subsequence is descrambled, so that a quantity of decoding times is reduced, and implementation complexity is reduced.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedures or functions according to the embodiments of this application are all or partially generated. The computer may be a general-purpose computer, a special-purpose computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave) manner. The computer readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD (Digital Video Disc)), a semiconductor medium (for example, a solid state disk (SSD)), or the like.

What is claimed is:

1. A transmission method, applied to a network device and comprising:
   performing polar encoding on a bit sequence, to obtain an encoded sequence, wherein the bit sequence comprises control information and a cyclic redundancy check (CRC) sequence;
   fragmenting the bit sequence, after performing the polar encoding, to obtain n encoded subsequences, wherein n is an integer, and n>0;
   scrambling the n encoded subsequences by using n scrambling sequences respectively, to obtain n scrambled sequences;
   performing modulation and mapping operations on the n scrambled sequences; and
   sending the n scrambled sequences after performing the modulation and mapping operations,
   wherein the scrambling the n encoded subsequences by using the n scrambling sequences respectively comprises:
   performing an exclusive-OR operation on an odd-numbered vector and an even-numbered vector of each of the n encoded subsequences by using each of the n scrambling sequences.

2. The method according to claim 1, wherein the n scrambling sequences carry $\lceil \log_2 n \rceil$-bit information.

3. The method according to claim 1, wherein the control information is a master information block (MIB).

4. A transmission method, applied to a terminal and comprising:
   receiving, by the terminal, a symbol sequence, wherein the symbol sequence is obtained by a network device after the network device encodes control information by using a polar code, and scrambles, modulates, and maps encoded control information;
   demapping and demodulating, by the terminal, the symbol sequence, to obtain an encoded sequence;
   selecting, by the terminal, at least one encoded subsequence from the encoded sequence;
   performing, by the terminal, polar decoding on the at least one encoded subsequence, to obtain a bit sequence, wherein the bit sequence comprises the control information and a Cyclic Redundancy Check (CRC) sequence; and
   performing, by the terminal, a descrambling operation on the bit sequence by using at least one descrambling sequence, and performing a CRC check on a descrambled bit sequence, to obtain the control information and timing information if the CRC check succeeds,
   wherein the performing, by the terminal, the polar decoding on the at least one encoded subsequence comprises:
   decoding, by the terminal, one encoded subsequence and
   wherein the performing, by the terminal, the descrambling operation on the bit sequence by using the at least one descrambling sequence, and the performing the CRC check on the descrambled bit sequence comprises:
   performing, by the terminal, the descrambling operation on the bit sequence by using each of four descrambling sequences, and further performing CRC check on the descrambled bit sequence obtained each time, to obtain the control information if the CRC check succeeds; and
   obtaining, by the terminal, the timing information based on a sequence number of a descrambling sequence corresponding to the successful CRC check.

5. The method according to claim 4, wherein the control information is a master information block (MIB).

6. A transmission apparatus, comprising:
   a processor; and
   a memory storing instructions that when executed configure the processor to perform steps comprising:
   receiving a symbol sequence, wherein the symbol sequence is obtained by a network device after the network device encodes control information by using a polar code, and scrambles, modulates, and maps encoded control information;
   demapping and demodulating the symbol sequence, to obtain an encoded sequence;
   selecting at least one encoded subsequence from the encoded sequence;
   performing polar decoding on the at least one encoded subsequence, to obtain a bit sequence, wherein the bit sequence comprises the control information and a Cyclic Redundancy Check (CRC) sequence;
   performing a descrambling operation on the bit sequence by using at least one descrambling sequence; and performing a CRC check on the bit sequence after performing the descrambling operation, to obtain the control information and timing information if the CRC check succeeds, wherein the performing the polar decoding on the at least one encoded subsequence comprises:

decoding one encoded subsequence; and wherein the performing the descrambling operation on the bit sequence and the performing the CRC check on the bit sequence, after performing the descrambling operation comprises:

performing a descrambling operation on the bit sequence by using each of four descrambling sequences, and further performing a CRC check on a descrambled bit sequence obtained each time, to obtain the control information if the CRC check succeeds; and obtaining the timing information based on a sequence number of a descrambling sequence corresponding to the successful CRC check.

7. The apparatus according to claim 6, wherein the control information is a master information block (MIB).

\* \* \* \* \*